(12) United States Patent
Mizutani

(10) Patent No.: US 7,791,197 B2
(45) Date of Patent: Sep. 7, 2010

(54) SEMICONDUCTOR DEVICE, CONNECTING MEMBER, METHOD FOR MANUFACTURING A SEMICONDUCTOR DEVICE AND METHOD FOR MANUFACTURING A CONNECTING MEMBER

(75) Inventor: Daisuke Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 181 days.

(21) Appl. No.: 12/068,593

(22) Filed: Feb. 8, 2008

(65) Prior Publication Data
US 2008/0197492 A1  Aug. 21, 2008

(30) Foreign Application Priority Data
Feb. 20, 2007  (JP)  .............................. 2007-039528

(51) Int. Cl.
*H01L 23/488* (2006.01)
(52) U.S. Cl. .............................. 257/737; 257/E23.023; 257/E21.511; 438/121
(58) Field of Classification Search ................ 257/737, 257/E23.023, E21.511
See application file for complete search history.

(56) References Cited
U.S. PATENT DOCUMENTS
6,717,066 B2 * 4/2004 Vandentop et al. .......... 174/260
7,097,462 B2 * 8/2006 Ichikawa ..................... 439/66

FOREIGN PATENT DOCUMENTS
JP  11-330160  11/1999

* cited by examiner

Primary Examiner—Evan Pert
Assistant Examiner—Krista Soderholm
(74) Attorney, Agent, or Firm—Kratz, Quintos, & Hanson, LLP

(57) ABSTRACT

A semiconductor device has a semiconductor element having a plurality of connection terminals, a circuit substrate electrically connected with the semiconductor element; and a connecting member arranged between the semiconductor element and the circuit substrate having a plurality of conductive projections each having a columnar portion, each of columnar portions are connected with each of connection terminals, a cross section of the columnar portion along a plane parallel to a surface of the semiconductor element being smaller than a surface area of each of connection terminals of the semiconductor element.

14 Claims, 4 Drawing Sheets

SEMICONDUCTOR DEVICE, CONNECTING MEMBER, METHOD FOR MANUFACTURING A SEMICONDUCTOR DEVICE AND METHOD FOR MANUFACTURING A CONNECTING MEMBER

TECHNICAL FIELD

The present invention relates to a semiconductor device having a mounting structure for electrically connecting a connection terminal of a semiconductor element to a circuit substrate with a connecting member, and to a method for manufacturing such a semiconductor device, to the connecting member and to a method for manufacturing such a connecting member.

BACKGROUND

With regard to semiconductor devices having a semiconductor element and a circuit substrate electrically connected to each other, higher speed and higher capacity in network apparatuses are in great demand. In order to achieve this, it is necessary to increase the mounting density of the semiconductor device and to increase the input/output pin count as the functions become more sophisticated. Japanese Unexamined Patent Application Publication No. hei 11-330160 discloses an example of a technology for corresponding to a higher input/output pin count. Specifically, in this technology, a network apparatus has a semiconductor element that is joined to a surface of a circuit substrate by means of solder balls arranged therebetween in a grid-like fashion.

A circuit substrate has a coefficient of thermal expansion that is greater than that of a semiconductor element. When the semiconductor element and the circuit substrate are being joined to each other at the melting temperature of the solder balls, the two are joined together with the solder in a state where the circuit substrate thermally expands by a large amount whereas the semiconductor element thermally expands by a small amount. For this reason, the circuit substrate and the semiconductor element become stressed in the cooling process of the solder. Likewise, the solder joining the circuit substrate and the semiconductor element together will also be under stress in the course of the cooling process. However, if the solder balls can withstand the stress or the stress is alleviated by plastic deformation so that the solder balls can maintain their shape, the connection between the circuit substrate and the semiconductor element can be maintained.

On the other hand, with the use of lead-free solder in recent years, the soldering temperature tends to be higher. For this reason, a large displacement may occur between the semiconductor element and the circuit substrate during the soldering step, causing an increase in the amount of stress applied to the solder balls. Because the solder balls are substantially spherical and have a large cross-sectional area, a large amount of stress is applied to the solder balls when such a displacement occurs between the semiconductor element and the circuit substrate. This is because the amount of stress depends on the product of the cross-sectional area and the displacement. When the solder balls receive such a large amount of stress, it becomes difficult for the solder balls to withstand the stress, thus resulting in cracking or disconnection of the solder balls. This is problematic in leading to lower mounting reliability between the semiconductor element and the circuit substrate.

SUMMARY

The present invention provides a semiconductor device having a semiconductor element having a plurality of connection terminals, a circuit substrate electrically connected with the semiconductor element; and a connecting member arranged between the semiconductor element and the circuit substrate having a plurality of conductive projections each having a columnar portion, each of columnar portions are connected with each of connection terminals, a cross section of the columnar portion along a plane parallel to a surface of the semiconductor element being smaller than a surface area of each of connection terminals of the semiconductor element.

DETAILED DESCRIPTION OF THE EMBODIMENTS

The first embodiment of the present invention will be described with reference to FIGS. 1 and 2 with a semiconductor device as an example. The semiconductor device according to the first embodiment employs conductive projections as a connecting member so as to achieve improved mounting reliability between a semiconductor element and a circuit substrate.

Figure 1:
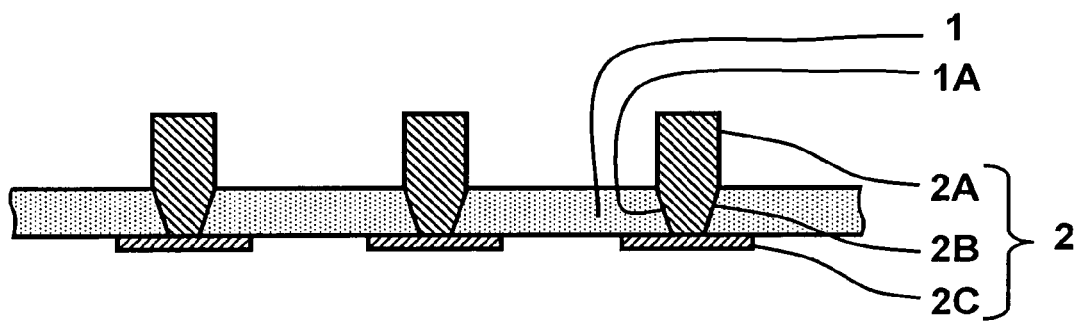
FIG. 1 is a cross-sectional view of a connecting member according to a first embodiment.

FIG. 1 is a cross-sectional view of a connecting member 10 according to the first embodiment.

The connecting member 10 includes an insulating sheet 1 having tapered holes 1A, and conductive projections (connecting member) 2 each having a columnar portion 2A, a tapered portion 2B, and an electrode portion 2C.

The insulating sheet 1 is composed of polyimide resin and has high insulation properties, high heat resistance, and high mechanical strength. The thickness of the insulating sheet 1 is between 5 μm and 20 μm. In the first embodiment, the insulating sheet 1 is given a thickness of, for example, 20 μm. The coefficient of thermal expansion of the insulating sheet 1 is 7 ppm, and is preferably set to an intermediate value between the coefficient of thermal expansion of a semiconductor element 4, which is 3 ppm, and the coefficient of thermal expansion of a circuit substrate 3, which is 12 ppm. The semiconductor element 4 and the circuit substrate 3 will be described hereinafter. The tapered holes 1A are arranged in a grid-like fashion in the insulating sheet 1. Such a grid-like arrangement of the tapered holes 1A allows for a higher mounting density of the conductive projections 2 and can correspond to a high pin count. Each of the tapered holes 1A has an upper diameter that is between 60 μm and 100 μm and a lower diameter that is between 40 μm and 80 μm. In the first embodiment, the upper diameter of each tapered hole 1A is, for example, 80 μm, and the lower diameter thereof is, for example, 60 μm.

As mentioned above, each conductive projection 2 has the columnar portion 2A, the tapered portion 2B, and the electrode portion 2C. The conductive projection 2 is preferably composed of, for example, copper. The columnar portion 2A has a diameter that is between 60 μm and 100 μm The diameter of the columnar portion 2A is fixed. The columnar portion 2A has a height of, for example, 50 μm.

The tapered portions 2B have the same shape as the tapered holes 1A. Each tapered portion 2B has an upper diameter that is between 60 μm and 100 μm and a lower diameter that is between 40 μm and 80 μm. The diameter of the columnar portions 2A may be substantially the same as the upper diameter of the tapered portions 2B. In the first embodiment, the upper diameter of each tapered portion 2B is, for example, 80 μm, and the lower diameter thereof is, for example, 60 μm. The tapered portion 2B has a height of, for example, 20 μm. The cross-sectional area of the tapered portion 2B decreases from the end thereof adjoining the corresponding columnar portion 2A towards the end thereof adjoining the corresponding electrode portion 2C. The conductive projections 2 are supported by the tapered holes 1A formed in the insulating sheet 1. Although the tapered holes 1A and the tapered portions 2B have a circular cross section in the first embodiment, the cross section thereof is not limited to a circular shape and may be, for example, a triangular shape, a rectangular shape, or a star shape.

The electrode portions 2C each have a thickness of, for example, 10 μm. The electrode portions 2C are disposed and patterned on one of the surfaces of the insulating sheet 1. The connecting member 10 is a so-called post grid array film in which the conductive projections 2 are arranged in a grid-like fashion in the insulating sheet 1 at predetermined intervals. Specifically, the conductive projections 2 are arranged in the insulating sheet 1 at a 180 μm pitch. As mentioned above, each conductive projection 2 includes the columnar portion 2A, the tapered portion 2B, and the electrode portion 2C. The tapered portion 2B and the electrode portion 2C of each conductive projection 2 are fixed with the insulating sheet 1 held therebetween. This prevents the conductive projections 2 from falling out of the insulating sheet 1 during handling of the connecting member 10.

Figure 2:
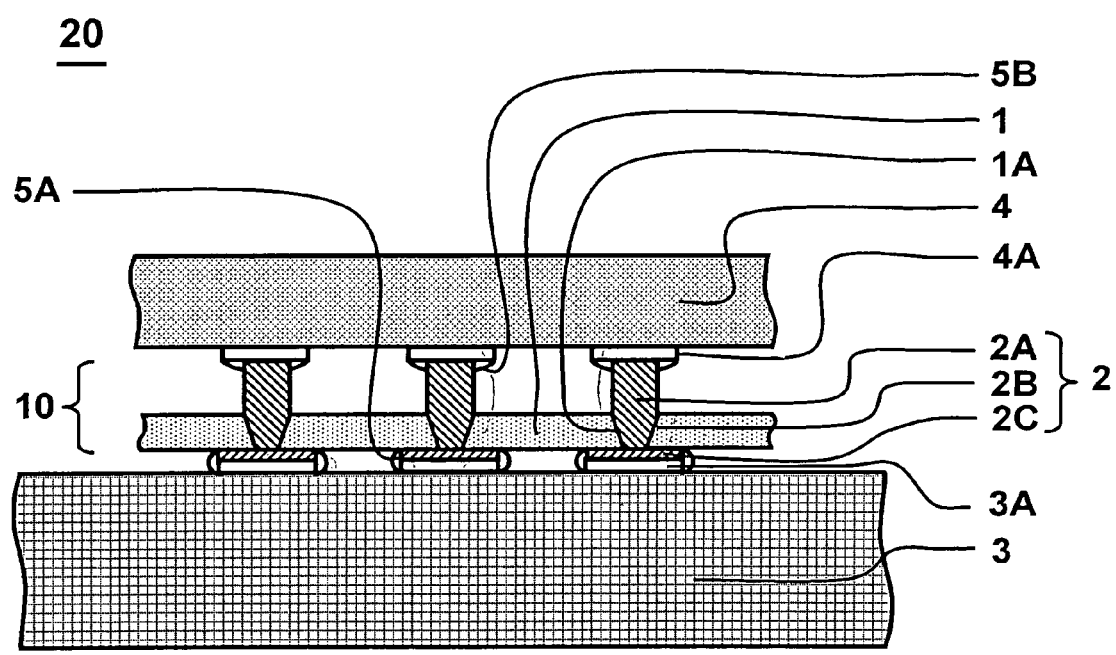
FIG. 2 is a cross-sectional view of a semiconductor device according to the first embodiment.

FIG. 2 is a cross-sectional view of a semiconductor device 20 according to the first embodiment. In addition to having the connecting member 10 shown in FIG. 1, which includes the insulating sheet 1 having the tapered holes 1A and the conductive projections 2 having the columnar portions 2A, the tapered portions 2B, and the electrode portions 2C, the semiconductor device 20 includes the circuit substrate 3, connection terminals 3A of the circuit substrate 3, the semiconductor element 4, connection terminals 4A of the semiconductor element 4, solder 5A, and solder 5B. Components shown in FIG. 2 that are exactly the same as those shown in FIG. 1 are given the same reference numerals.

Referring to FIG. 2, the circuit substrate 3 is a glass-epoxy substrate or a buildup substrate forming by stacking an insulating layer and a wiring layer one on top of the other. In a case where a buildup substrate is used, the coefficient of thermal expansion of the circuit substrate 3 is substantially 12 ppm. One of the surfaces of the circuit substrate 3 is provided with the connection terminals 3A. The connection terminals 3A are composed of copper or nickel.

The semiconductor element 4 is formed by cutting a silicon wafer into chip segments. The connection terminals 4A of the semiconductor element 4 are pads that apply voltage to the semiconductor element 4, and are composed of, for example, aluminum (Al). The connection terminals 4A are formed on one of the surfaces of the semiconductor element 4. The area of cross section of each columnar portion 2A taken along a plane parallel to the surface of the semiconductor element 4 is smaller than the surface area of each connection terminal 4A of the semiconductor element 4. The circuit substrate 3 and the semiconductor element 4 are electrically connected to each other with the conductive projections 2 of the connecting member 10.

The solder 5A and the solder 5B are lead-free solder and are composed of, for example, a tin-silver-copper (Sn—Ag—Cu) alloy. The melting point of the solder 5A and the solder 5B is, for example, 218° C. The solder 5A has an elastic modulus of, for example, 41.6 GPa. The solder 5A serves as a bonding material for electrically bonding the electrode portions 2C of the conductive projections 2 and the connection terminals 3A of the circuit substrate 3 together. Likewise, the solder 5B serves as a bonding material for electrically bonding the columnar portions 2A of the conductive projections 2 and the connection terminals 4A together.

A stress applied to the conductive projections 2 is determined from the product of the cross-sectional area of the conductive projections 2, the elastic modulus of the material used for the conductive projections 2, and displacement that occurs between the circuit substrate 3 and the semiconductor element 4 when the two undergo different dimensional changes in the mounting-surface direction during a heating process thereof. This means that the smaller the area of cross section of each columnar portion 2A taken along the plane parallel to the surface of the semiconductor element 4, the less each conductive projection 2 will be under stress. On the other hand, there may be a case where the material used for the conductive projections 2 has an elastic modulus that is higher than that of solder. In that case, the stress applied to the conductive projections 2 can be reduced by allowing the cross-sectional area of the columnar portions 2A to be a value inversely proportional to a value obtained by dividing the elastic modulus of the material used for the conductive projections 2 by the elastic modulus of the solder 5A and solder 5B. For example, in a case where the material used for the conductive projections 2 is copper, the elastic modulus of the conductive projections 2 will be 70 GPa. This elastic modulus is approximately 1.7 times the elastic modulus of lead-free solder, which is 41.6 GPa. With the aforementioned conductive projections 2, the area of cross section of the columnar portions 2A taken along the plane parallel to the surface of the semiconductor element 4 can be reduced to ¼ or less of a cross-sectional area of solder balls formed by using lead-free solder taken along the plane parallel to the surface of the semiconductor element 4. Therefore, the stress applied to the conductive projections 2 can be reduced to approximately 40%. Consequently, even if the circuit substrate 3 and the semiconductor element 4 undergo different dimensional changes in the mounting-surface direction during a heating process thereof, the stress applied to the conductive projections 2 can be alleviated. This enhances the mounting reliability between the circuit substrate 3 and the semiconductor element 4.

Moreover, the area of cross section of the columnar portions 2A taken along the plane parallel to the surface of the semiconductor element 4 is smaller than the surface area of the connection terminals 4A of the semiconductor element 4. Therefore, the shape of each conductive projection 2 is maintained even if displacement occurs at the opposite ends of the conductive projection 2 after the conductive projection 2 and the corresponding connection terminal 4A of the semiconductor element 4 are connected to each other with the solder 5B. The area of cross section of the columnar portions 2A taken along the plane parallel to the surface of the semiconductor element 4 is set such that the conductive projections 2 are prevented from breaking when the circuit substrate 3 and the semiconductor element 4 undergo different dimensional changes in the mounting-surface direction during a heating process thereof. Consequently, the contact area between the connection terminals 4A and the conductive projections 2 can be reduced, thereby reducing the stress applied to the conductive projections 2. Reducing the stress on the conductive projections 2 can advantageously improve the mounting reliability.

The coefficient of thermal expansion of the insulating sheet 1 is an intermediate value between the coefficient of thermal expansion of the circuit substrate 3 and the coefficient of thermal expansion of the semiconductor element 4. Therefore, if the circuit substrate 3 and the semiconductor element 4 undergo different dimensional changes in the mounting-surface direction during a heating process thereof, a stress accumulating on the insulating sheet 1 can be reduced since the degree of dimensional change in the insulating sheet 1 is between those of the circuit substrate 3 and the semiconductor element 4.

FIGS. 3A to 3F illustrate a process for manufacturing a connecting member according to the second embodiment.

Figure 3A:
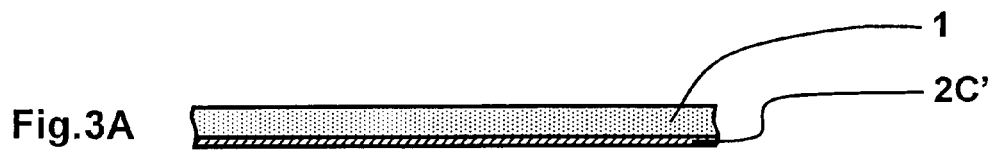
FIGS. 3A to 3F illustrate a process for manufacturing a connecting member according to a second embodiment.
Figure 3B:
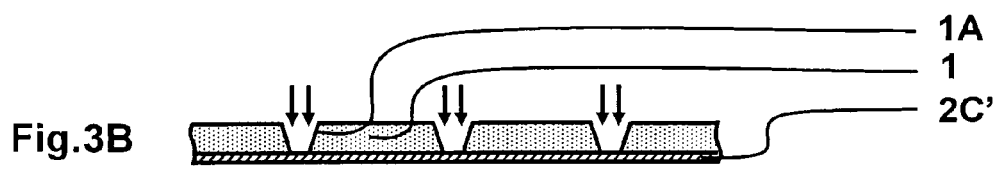

FIGS. 3A and 3B illustrate steps for forming tapered holes in an insulating sheet having a conductive layer on one surface thereof. Specifically, the tapered holes are formed so that the conductive layer on the one surface of the insulating sheet is exposed at the other surface thereof through the holes. FIG. 3A illustrates an insulating sheet 1 and an electrode layer 2C'.

The insulating sheet 1 is the same as the insulating sheet 1 shown in FIG. 1. As the insulating sheet 1, an Upilex (registered trademark) film manufactured by Ube Industries, Ltd. is used. The electrode layer 2C' is formed of a copper foil. The thickness of the electrode layer 2C' is, for example, 10 μm. The electrode layer 2C' is formed over one surface of the insulating sheet 1.

Next, referring to FIG. 3B, tapered holes 1A according to the second embodiment are formed such that each tapered hole 1A has an upper diameter that is between 60 μm and 100 μm and a lower diameter that is between 40 μm and 60 μm. For example, the tapered holes 1A are formed at a 180 μm pitch using a carbon dioxide gas laser or an yttrium aluminum garnet (YAG) laser. The size or shape of the tapered holes 1A is adjustable in accordance with, for example, the radiation condition of the laser.

Figure 3C:
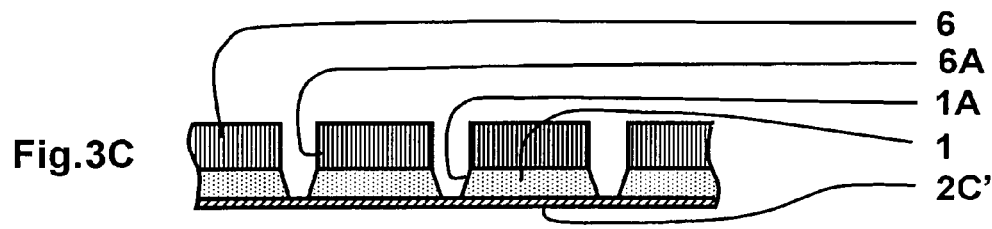

Referring to FIG. 3C, a photo-etching agent, for example, is applied over the insulating sheet 1 so as to form a plating resist 6. Then, a photosensitive dry film is bonded onto the plating resist 6 and is subject to exposure and development steps, thereby forming holes 6A. The plating resist 6 is formed to a thickness of, for example, 50 μm. Each of the holes 6A has an aperture area that is equal to the larger cross-sectional area of the corresponding tapered hole 1A.

Figure 3D:
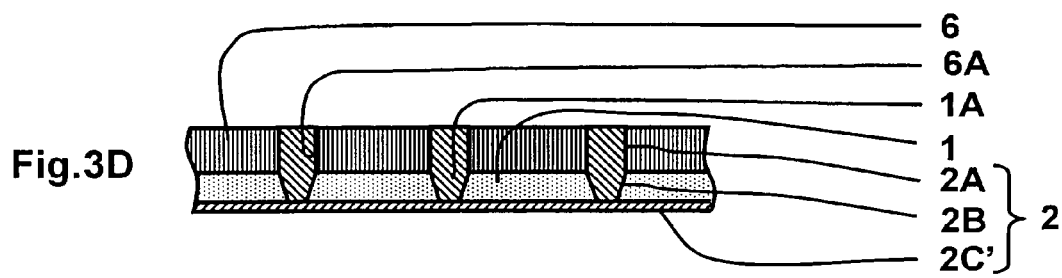

Subsequently, referring to FIG. 3D, electrolytic copper plating is performed to form conductive projections 2 having the electrode layer 2C' as an electrode.

Figure 3E:
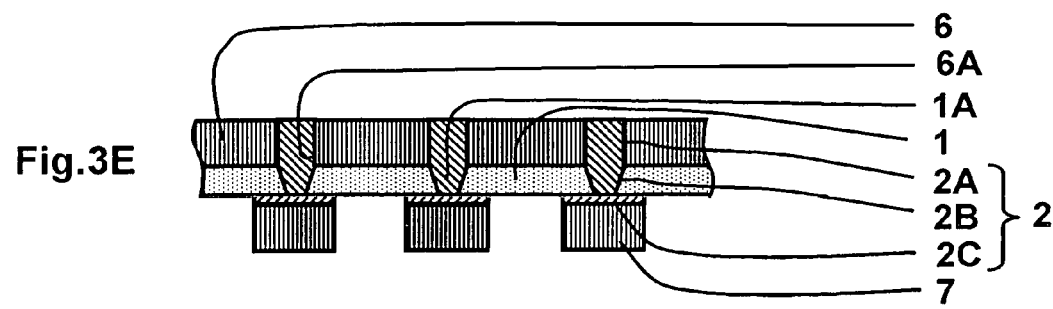

Then, referring to FIG. 3E, the plating resist 7 is formed over the tapered hole 1A and on the other surface of the electrode layer 2C'. Then, the electrode portions 2C is formed so as to etch the electrode layer 2C' using the plating resist 7 as a mask.

Figure 3F:
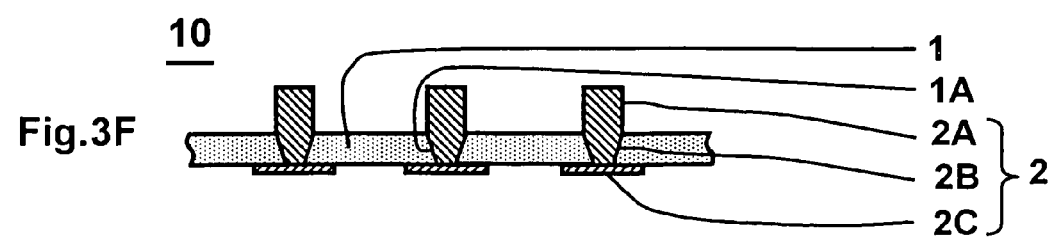

Referring to FIG. 3F, the plating resist 6 and the plating resist 7 are removed using, for example, an organic solvent, thereby forming a connecting member 10 as shown in FIG. 1.

Figure 4A:
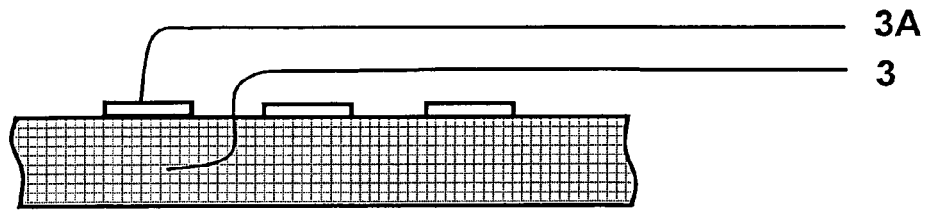
FIGS. 4A to 4C illustrate a process for manufacturing a semiconductor device according to the second embodiment.
Figure 4B:
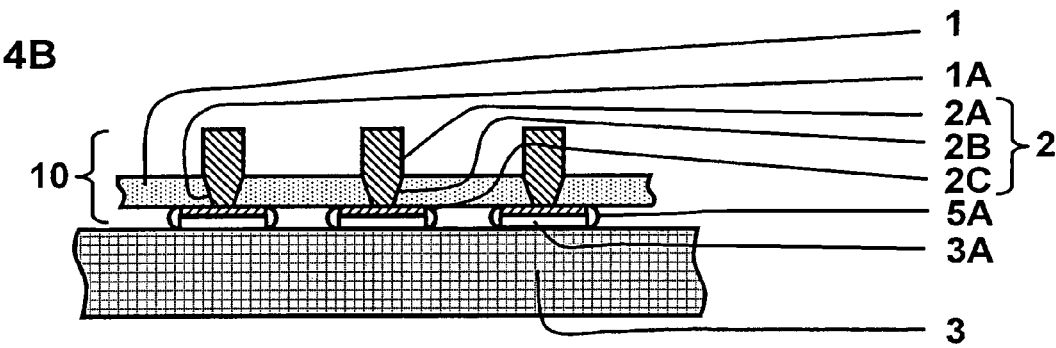
Figure 4C:
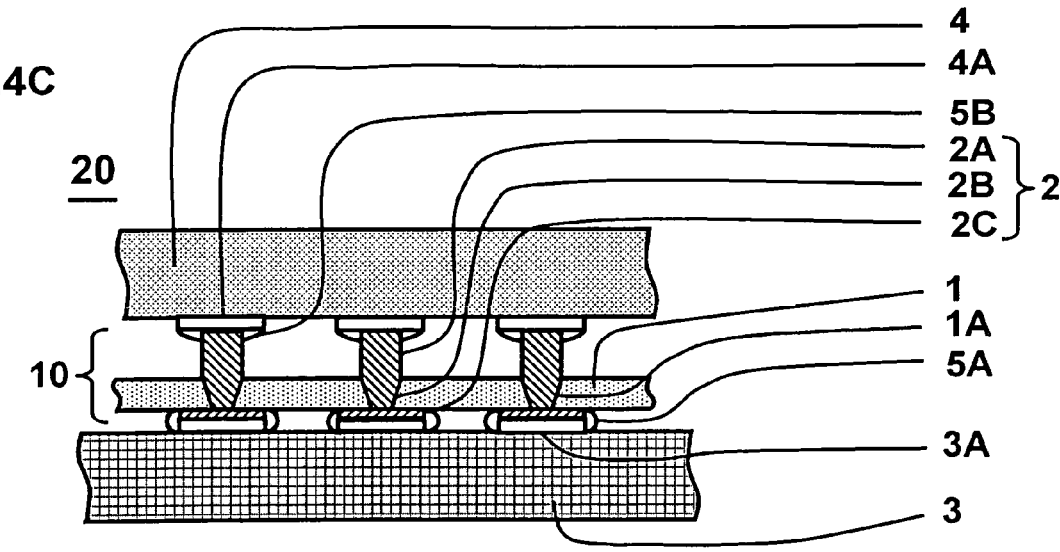

FIGS. 4A to 4C illustrate a process for manufacturing the semiconductor device according to the second embodiment.

FIG. 4A shows a step for preparing a circuit substrate 3. The circuit substrate 3 is, for example, a glass-epoxy substrate or a buildup substrate. In the second embodiment, a buildup substrate is used. The coefficient of thermal expansion of the circuit substrate 3 is, for example, 12 ppm. One of the surfaces of the circuit substrate 3 is provided with connection terminals 3A. The connection terminals 3A are composed of conductive material, for example, copper or nickel.

Next, referring to FIG. 4B, the connection terminals 3A of the circuit substrate 3 and the electrode portions 2C of the connecting member 10 formed as a result of the steps shown in FIGS. 3A to 3F are positionally aligned with each other. A surface of each connection terminal 3A has solder (not shown) applied thereon. Subsequently, a reflow process is performed so that the connection terminals 3A and the electrode portions 2C become electrically and mechanically joined to each other with solder 5A.

Then, referring to FIG. 4C, the conductive projections 2 of the connecting member 10 and connection terminals 4A of a semiconductor element 4 are positionally aligned with each other. Subsequently, a reflow process is performed so that the connection terminals 4A and the conductive projections 2 become electrically and mechanically joined to each other with solder 5B. As a result, a semiconductor device 20 is formed.

There are various regulations for the circuit substrate and the semiconductor element depending on the connection method and the environment they are used in, and the connection terminals in the circuit substrate and the semiconductor element do not necessarily always have a fixed surface area. With the use of the connecting member as shown in FIGS. 3A to 3F and FIGS. 4A to 4C, which is equipped with the conductive projections whose columnar portions have a fixed area of cross section taken along a plane parallel to the surface of the semiconductor element, a structure shown in FIGS. 1 and 2 that connects the connection terminals to each other with the conductive projections having a small cross-sectional area can be readily achieved.

In addition, with the method for manufacturing the mounting structure and the method for manufacturing the semiconductor device according to the present invention, the conductive projections 2 can be formed in a state where they are held by the insulating sheet 1. Accordingly, this improves the handling properties when the conductive projections 2 are being formed, and also simplifies the manufacturing process of the semiconductor device.

Furthermore, the area of cross section of each columnar portion 2A taken along a plane parallel to the surface of the semiconductor element 4 is smaller than the surface area of each connection terminal 4A of the semiconductor element 4. Specifically, the cross-sectional area of the columnar portions 2A is set such that the conductive projections 2 are prevented from breaking when the circuit substrate 3 and the semiconductor element 4 undergo different dimensional changes in the mounting-surface direction during a heating process thereof. Thus, the contact area between the connection terminals 3A and the conductive projections 2 can be reduced, thereby reducing stress applied to the conductive projections 2. Reducing the stress on the conductive projections 2 can advantageously improve the mounting reliability.

The technical scope of the present invention is not limited to the above embodiments, and modifications are permissible without departing from the scope of the invention.

What is claimed is:
1. A semiconductor device, comprising:
  a semiconductor element having a plurality of connection terminals;
  a circuit substrate electrically connected with the semiconductor element; and a connecting member arranged between the semiconductor element and the circuit substrate having a plurality of conductive projections each having a columnar portion, each of columnar portions being connected with each of connection terminals, a cross section of the columnar portion along a plane parallel to a surface of the semiconductor element being smaller than a surface area of each of connection terminals of the semiconductor element;

wherein the conductive projection and the semiconductor element are bonded by a solder, and the cross-section columnar portion is inversely proportional to a value obtained by dividing the elastic modulus of a material used for the conductive projection by an elastic modulus of the solder.

2. The semiconductor device according to claim 1, wherein the conductive projection has a tapered portion and an electrode portion, and a cross-section of the tapered portion along a plane parallel to a semiconductor element decreases from the end adjoining the corresponding columnar portion towards the end adjoining the corresponding electrode portion.

3. The semiconductor device according to claim 1, wherein the conductive projection is supported by an insulating sheet.

4. The semiconductor device according to claim 3, wherein the insulating sheet has a coefficient of thermal expansion which is an intermediate value between a coefficient of thermal expansion of the circuit substrate and a coefficient of thermal expansion of the semiconductor element.

5. A connecting member for electrically connecting a semiconductor element and a circuit substrate, comprising:

a plurality of conductive projections each having a columnar portion, each of columnar portions being connected with a connection terminal of the semiconductor element;

a cross section of the columnar portion along a plane parallel to a surface of the semiconductor element being smaller than a surface area of the connection terminal;

wherein the conductive projection and the semiconductor element are bonded by a solder, and the cross-section of the columnar portion is inversely proportional to a value obtained by dividing elastic modulus of a material used for the conductive projection by an elastic modulus of the solder.

6. The connecting member according to claim 5, wherein the conductive projection has a tapered portion and an electrode portion, and a cross-section of the tapered portion along a plane parallel to the semiconductor element decreases from the end adjoining the corresponding columnar portion towards the end adjoining the corresponding electrode portion.

7. The connecting member according to claim 5, wherein the conductive projection is supported by an insulating sheet.

8. The connecting member according to claim 5, wherein the insulating sheet has a coefficient of thermal expansion which is an intermediate value between a coefficient of thermal expansion of the circuit substrate and a coefficient of thermal expansion of the semiconductor element.

9. A method for manufacturing a semiconductor device, comprising:

connecting a connecting member with a circuit substrate; and connecting the connecting member with a semiconductor element, wherein the connecting member includes a plurality of conductive projection each having a columnar portion, each of columnar portions is connected with a connection terminal of the semiconductor element, a cross section of the columnar portion along a plane parallel to a surface of the semiconductor element being smaller than a surface area of the connection terminal;

wherein the conductive projection and the semiconductor element are bonded by a solder, and the cross-section of the columnar portion is inversely proportional to a value obtained by dividing the elastic modulus of a material used for the conductive projection by an elastic modulus of the solder.

10. The method for manufacturing a semiconductor device according to claim 9, wherein the conductive projection has a tapered portion and an electrode portion, and a cross-section of the tapered portion along a plane parallel to a semiconductor element decreases from the end adjoining the corresponding columnar portion towards the end adjoining the corresponding electrode portion.

11. The method for manufacturing a semiconductor device according to claim 9, wherein the conductive projection is supported by an insulating sheet.

12. The method for manufacturing a semiconductor device according to claim 11, wherein the insulating sheet has a coefficient of thermal expansion which is an intermediate value between a coefficient of thermal expansion of the circuit substrate and a coefficient of thermal expansion of the semiconductor element.

13. A method for manufacturing a connecting member, comprising:

forming holes in an insulating sheet having a conductive layer on one surface;

filling the holes from an other surface of the insulating sheet by a conductive material;

forming conductive projections having a columnar portion over the holes; and forming electrode portions over the holes and on the other surface of the insulating sheet;

wherein the cross-section of the columnar portion, is inversely proportional to a value obtained by dividing an elastic modulus of a material used for the conductive projection by an elastic modulus of the solder.

14. The method for manufacturing a connecting member according to claim 13, wherein the holes have a tapered portion and a cross-section of the tapered portion decreases towards the conductive layer.

* * * * *